(12) United States Patent
Pang et al.

(10) Patent No.: US 7,733,021 B2
(45) Date of Patent: Jun. 8, 2010

(54) LIGHT EMITTING DEVICE HAVING AN OPTICAL MODIFICATION ELEMENT WITH UNIFORM THICKNESS

(75) Inventors: Siew It Pang, Penang (MY); Tong Fatt Chew, Penang (MY)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 230 days.

(21) Appl. No.: 11/943,875

(22) Filed: Nov. 21, 2007

(65) Prior Publication Data

US 2008/0062672 A1 Mar. 13, 2008

Related U.S. Application Data

(62) Division of application No. 10/841,755, filed on May 7, 2004, now Pat. No. 7,315,119.

(51) Int. Cl.
*H01J 1/62* (2006.01)
(52) U.S. Cl. ................... 313/512; 313/506; 313/509; 445/24

(58) Field of Classification Search .......... 313/498–512
See application file for complete search history.

(56) References Cited

U.S. PATENT DOCUMENTS

| 2002/0079837 A1* | 6/2002 | Okazaki | 313/512 |
| 2005/0093430 A1* | 5/2005 | Ibbetson et al. | 313/501 |

* cited by examiner

*Primary Examiner*—Bumsuk Won

(57) ABSTRACT

A light emitting device is disclosed herein. An embodiment of the light emitting device includes a cavity and at least one light emitter located within the cavity. A first transparent material fills at least a portion of the cavity and encapsulates the light emitter. A substantially rigid optical modifying element is located adjacent the first transparent material, the modifying element comprises particles that emit at least one first wavelength of light upon being illuminated by a second wavelength of light. The modifying element has a first side located adjacent the first transparent material and a second side located opposite the first side, wherein the first side is substantially flat. In addition, the modifying element is substantially uniform in thickness.

18 Claims, 2 Drawing Sheets

LIGHT EMITTING DEVICE HAVING AN OPTICAL MODIFICATION ELEMENT WITH UNIFORM THICKNESS

BACKGROUND

Some light emitting devices include a light emitter, such as a light-emitting diode (LED), that is contained within a substrate, wherein the substrate may include a reflector. The LED is typically encapsulated with a substantially transparent material. In order to obtain different colors or wavelengths of light, the transparent material may contain phosphor or the like, which emits different wavelengths of light upon being illuminated or having light incident thereon. The wavelengths of light emitted by the phosphor are typically different than the wavelengths that illuminate the phosphor.

In order to have uniform illumination, the thickness of the phosphor material needs to be uniform. However, if the phosphor material is added as a separate liquid layer during the manufacturing process, maintaining uniformity is difficult. Surface tension and meniscus on the transparent layer may form an uneven surface on which to apply a layer containing the phosphor. When the layer containing the phosphor is applied, it is uneven due to the problems with the transparent layer on which it is applied. In addition, the aforementioned surface tension and meniscus may apply to the layer containing phosphor, which further reduces the uniformity of the layer.

DETAILED DESCRIPTION

Figure 1:
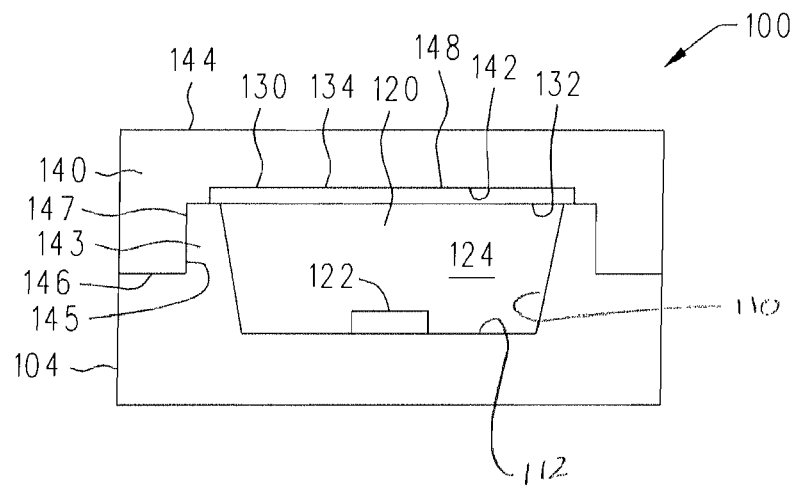
FIG. 1 is a side cut away view of an embodiment of a light emitting device.

A side cut away view of a light emitting device 100 is shown in FIG. 1. The light emitting device 100 has a substrate 104 that may be made of a material, such as plastic or other polymers, that structurally supports the light emitting device 100. The substrate 104 has an interior wall 110 and an interior floor 112 that define a cavity 120. The wall 110 may be continuous so as to surround the cavity 120. In other embodiments, the cavity 120 may have several walls 110. The wall 110 and/or floor 112 may be coated with a reflective material or may be reflective so as to reflect light as described in greater detail below.

The floor 112 may be substantially flat and supports at least one light emitter 122. In the embodiments described herein, the light emitter 122 is a light-emitting diode (LED). However, other light emitting devices may be used herein. The LED 122 emits at least one wavelength or color of light. The wavelength of light emitted by the LED 122 may be reflected from the wall 110 and/or floor 112 as described above.

The cavity 120 is filled with a first substantially transparent material 124. Substantially transparent means that the material passes the wavelengths of light emitted by the LED 122 and is not selected to attenuate the wavelengths of light emitted by the LED 122. In a broader definition, substantially transparent means that light entering the material is not attenuated as is passes through the material. A substantially transparent material may diffuse light. An example of the first transparent material 124 includes silicon. In some embodiments, the first transparent material 124 is applied to the cavity 120 as a liquid that subsequently hardens or gels. The first transparent material 124 serves to keep contaminants from the LED 122. The first transparent material 124 may also serve to support the LED 122 by encapsulating the LED 122. Thus, the first transparent material 124 is sometimes referred to as an encapsulant.

A rigid optical modification element 130 (sometimes referred to herein simply as the modification element 130) is located adjacent the first transparent material 124. The modification element 130 has a first side 132 that faces the first transparent material 124 and a second side 134 located opposite the first side 132. The modification element 130 may be substantially flat meaning that the first side 132 is substantially parallel to the second side 134. Substantially flat also means that no intentional bends or curves have been applied to the modification element 130. As stated above, the modification element 130 is rigid and may be cut from a larger sheet of material. The term rigid includes the modification element being in a solid form before being applied to the light emitting device 100.

The modification element 130 is filled with or impregnated with particles or materials that emit light upon being illuminated. In some embodiments, the particles comprise phosphor. More specifically, the particles are illuminated with a first wavelength of light emitted by the LED 122 and they emit light having a second wavelength. In some embodiments, the particles are illuminated by a band of light or several different wavelengths of light and emit a band or several different wavelengths of light. The first transparent material 124 may serve to control the distance of the modification element 130 from the LED 122 so as to improve illumination of the light emitting device 100. In some embodiments, the modification element 130 is located more than 0.5 millimeters from the LED 122.

A second substantially transparent material 140 may be located adjacent the modification element 130. The second transparent material 140 has a first side 142 located adjacent the modification element 130 and a second side 134 located opposite the first side. The second transparent material 140 serves to protect the modification element 130. The second transparent material 140 may also serve to diffuse or defract light as described in greater detail below.

Having described a basic embodiment of the light emitting device 100, its operation and benefits will now be described. Light emitted by the LED 122 passes through the first transparent material 124, wherein the first transparent material may or may not diffuse the light. The light emitted by the LED 122 consists of at least one wavelength or at least one band of wavelengths. The light encounters the modification element 130 and illuminates or becomes incident on the particles within the modification element 130. The particles then emit light of different wavelengths than those that are incident on the particles. Therefore, light emitted from the modification element 130 may consist of the wavelengths emitted by the LED 122 in addition to the wavelengths emitted by the particles. By changing the particles and concentrations thereof, the color of light emitted by the light emitting device 100 can be controlled.

Conventional light emitting devices typically pot or pour a liquid containing the particles on top of the first transparent material. This layer is referred to as a light modification layer.

This pouring presents problems with the uniformity of light emitted by the light emitting device. For example, surface tensions, including meniscus, cause the top of the first transparent layer to be curved. These same surface tensions cause the optical modification layer containing the particles to be curved. The combination of curved surfaces results in the optical modification layer not being uniform and flat. Therefore, light modification is not uniform throughout the area of the light modification layer. More specifically, more light may be modified in one region of the light modification layer than other regions.

As stated above, the optical modification layer and the first transparent material may not be flat due to surface tensions when they are poured. These curved surfaces cause light emitted by both the first transparent material and the optical modification layer to refract. The refraction may be unknown or relatively random, so that offsetting the refraction with optical elements located adjacent the optical modification layer may be futile.

The modification element 130 described herein is rigid as described above. Thus, the aforementioned problems associated with a liquid or gel modification layer are not present with the light emitting device 100 described herein. More specifically, the rigid modification element 130 is not subject to meniscus. In addition, the modification element 130 may be manufactured separate in order to control the thickness of the modification element 130 and the concentration of particles located therein. Thus, the colors emitted by the modification element 130 can be precisely controlled.

Manufacture of the light emitting device may include forming the substrate 104, which may be mounted to a circuit board or the like. The cavity 120 may be constructed using techniques known in the art. The LED 122 is then connected to the floor 112 of the substrate 104. The first transparent material 124 is added to the cavity 120. In some embodiments, the first transparent material 124 is added by pouring a liquid form of the first transparent material 124 into the cavity 120 where is subsequently hardens or gels.

The modification element 130 is then attached. In some embodiments the modification element 130 is attached to the first transparent material 124. In other embodiments, the modification element 130 is attached to the substrate 104. The attachment of the modification element 130 may be via an adhesive or the like. The second transparent material 140 may be added to the light emitting device 100 via an adhesive or the like. In some embodiments, the modification element 130 is attached to the second transparent material 140, then the combination is attached to the substrate 104.

Having described an embodiment of the light emitting device, other embodiments will now be described. In some embodiments, the first transparent material 124 may diffuse or scatter light so that the light incident on the modification element 130 is more uniform. Although the light is diffused or scattered, the transparent material remains substantially transparent. In addition, the second transparent material 140 may diffuse light.

In some embodiments, the substrate 104 has a ledge 143. The ledge 143 has an exterior wall 145. The second transparent material 140 has a protrusion 146 with an interior wall 147. The combination of the ledge 143 and the protrusion 146 enables the second transparent material 140 to fit snug against the substrate 104. More specifically, the interior wall 147 of the second transparent material 140 may fit against the exterior wall 145 of the ledge 143. An adhesive may be applied therebetween.

The second transparent material 140 may have a recessed portion 148 formed into the first side 142. The recessed portion 148 is sized to receive the modification element 130. Using the recessed portion 148 enables the cavity 120 to be completely filled with the first transparent material 124 because the modification element 130 does not interfere with the first transparent material 124. This controls the level and surface contours of the first transparent material 124 so that the surface of the first transparent material 124 can be flat and/or smooth without any surface tensions or meniscus.

Figure 2:
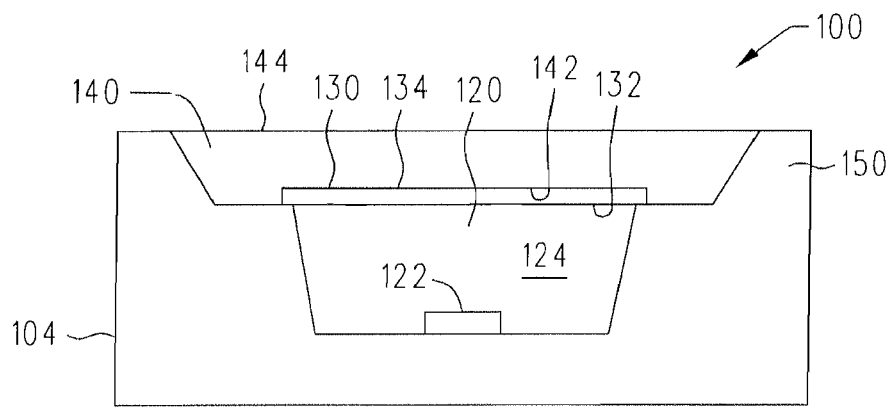
FIG. 2 is a side cut away view of another embodiment of a light emitting device.

FIG. 2 is an embodiment of the light emitting device 100 wherein the substrate 104 extends the length of the light emitting device 100. In this embodiment, the substrate 104 has a protrusion 150 that forms a cavity in which the second transparent material 140 is inserted and/or adhered. In some embodiments, the walls of the protrusion 150 may be reflective in order to improve the light intensity of the light emitting device 100.

Figure 3:
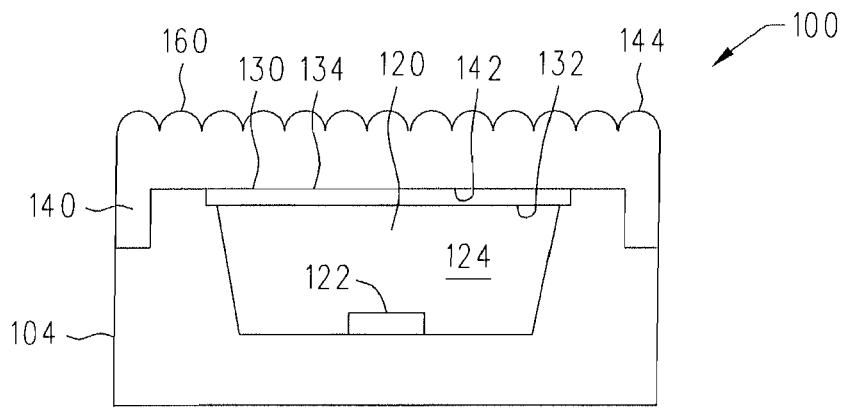
FIG. 3 is a side cut away view of another embodiment of a light emitting device having a plurality of lenses located thereon.

Another embodiment of the light emitting device 100 is shown in FIG. 3. This embodiment is similar to the embodiment of FIG. 1, except that the second side 144 of the second transparent material 140 has a plurality of lenses 160 located thereon. The lenses 160 may be a plurality of semi-spherical shaped lenses. In other embodiments, the lenses 160 may be semi-cylindrical shaped lenses. In similar embodiment, the second side 144 of the second transparent material 140 may be shaped as a single lens or have a single lens formed thereon. For example, the second side 144 may be substantially dome shaped. In some embodiments, the lenses are used to collimate the light emitted by the light emitting device 100.

Figure 4:
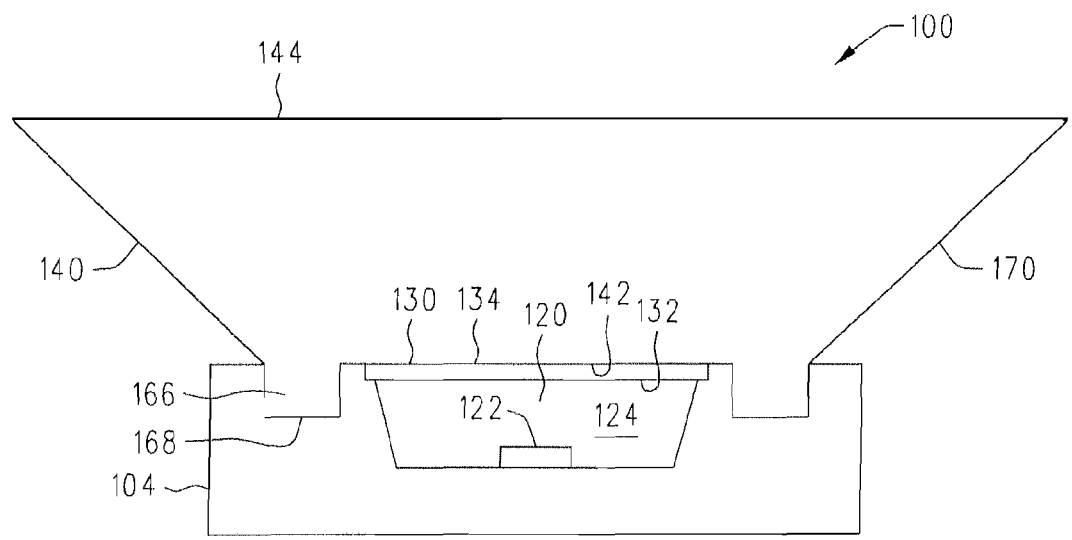
FIG. 4 is a side cut away view of another embodiment of a light emitting device for collimating light.
Figure 5:
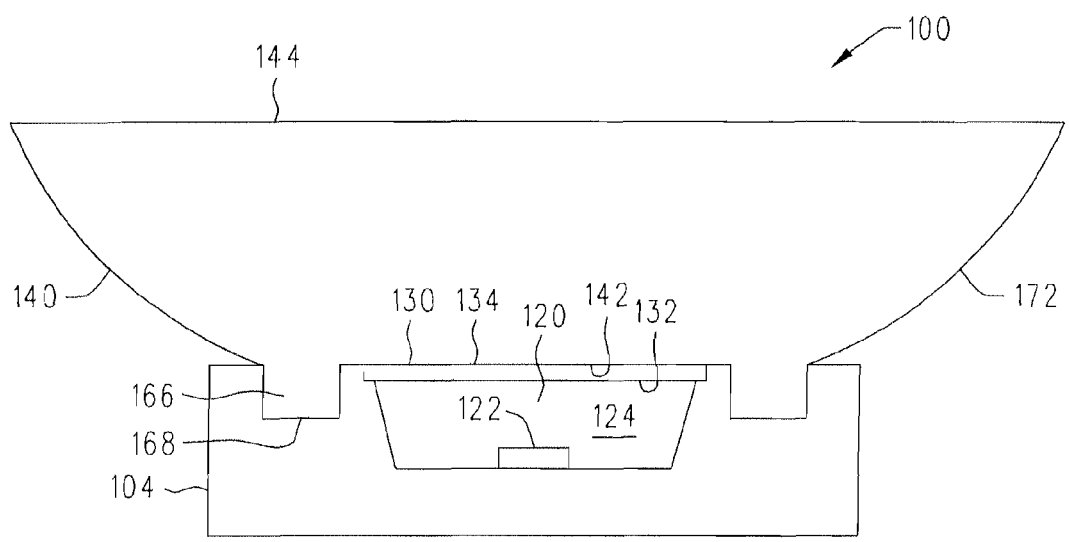
FIG. 5 is a side cut away view of another embodiment of a light emitting device for collimating light.

FIGS. 4 and 5 are side cut away view of embodiments of the light emitting devices 100 using different shapes of the second transparent material 140. The second transparent material 140 of FIG. 4 has a substantially flat wall 170, although the wall 170 may encircle the light emitting device 100. The embodiment of FIG. 4 has an indent 168 formed in the substrate 104 and a protrusion 166 formed into the second transparent material 140, wherein the indent 168 is formed to receive the protrusion 166. The protrusion 166 may fit into the indent 168 by friction or the use of an adhesive.

The light emitting device 100 of FIG. 5 has a curved or convex wall 172 that also may circle the light emitting device 100. The light emitting device 100 of FIG. 5 may also use a protrusion 166 and an indent 168 to secure the second transparent material 140 to the substrate 104. Both light emitting devices 100 of FIGS. 4 and 5 may serve to collimate light emitted therefrom. More specifically, the walls 170, 172 may be reflective so as to reflect light so as to be collimated. Other embodiments may serve to scatter the light in order to increase the viewing angle of the light emitting device 100.

What is claimed is:

1. A light emitting device comprising:
a cavity;
at least one light emitter located within said cavity;
a first transparent material filling at least a portion of said cavity, said first transparent material encapsulating said at least one light emitter; and
a planar optical modification element located adjacent said first transparent material, said optical modification element comprising particles that emit at least one first wavelength of light upon being illuminated by a second wavelength of light;
said optical modification element having a first side located adjacent said first transparent material and a second side located opposite said first side, said first side being substantially flat; and
said optical modification element being substantially uniform in thickness;

a second transparent material located adjacent said second side of said optical modification element, said second transparent material comprising a first side having a recessed portion located therein, said recessed portion being sized to receive said optical modification element.

2. The light emitting device of claim 1, wherein said second side of said optical modification element is substantially flat and parallel to said first side.

3. The light emitting device of claim 1, wherein said particles comprise phosphor.

4. The light emitting device of claim 1, wherein said second transparent material is substantially rigid.

5. The light emitting device of claim 1, wherein said second transparent material has a second side located opposite said first side, said second side having at least one lens formed therein.

6. The light emitting device of claim 5, wherein said at least one lens is semi-spherical in shape.

7. The light emitting device of claim 5, wherein said at least one lens is semi-cylindrical in shape.

8. The light emitting device of claim 1, wherein said second transparent material comprises a wall between said first side and said second side, said wall being substantially flat.

9. The light emitting device of claim 1, wherein said second transparent material comprises a wall between said first side and said second side, said wall being convex.

10. A method of manufacturing a light emitting device, said method comprising:

forming a cavity in a substrate;

mounting at least one light emitter within said cavity;

filling at least a portion of said cavity with a first transparent material, said first transparent material encapsulating said at least one light emitter;

fabricating a planar optical modification element, said optical modification element comprising particles that emit at least one first wavelength of light upon being illuminated by a second wavelength of light, said optical modification element having a first side located adjacent said first transparent material and a second side located opposite said first side, said first side being substantially flat, and said optical modification element being substantially uniform in thickness; and locating said optical modification element adjacent said first transparent material;

fabricating a second transparent material having a first side and a second side, wherein said first side of said second transparent material includes a recessed portion configured to receive said optical modification element;

locating said first side of said second transparent material adjacent said second side of said optical modification element.

11. The method of claim 10, wherein said second side of said optical modification element is substantially flat and parallel to said first side.

12. The method of claim 10, wherein said particles comprise phosphor.

13. The method of claim 10, wherein said second transparent material is substantially rigid.

14. The method of claim 10, wherein said second transparent material has a first side located adjacent said second side of said optical modification element and a second side located opposite said first side, said second side having at least one lens formed therein.

15. The method of claim 14, wherein said at least one lens is semi-spherical in shape.

16. The method of claim 14, wherein said at least one lens is semi-cylindrical in shape.

17. The method of claim 10, wherein said second transparent material comprises a wall between said first side and said second side, said wall being substantially flat.

18. The method of claim 10, wherein said second transparent material comprises a wall between said first side and said second side, said wall being convex.

* * * * *